(12) United States Patent
Yamaguchi et al.

(10) Patent No.: US 6,399,460 B1
(45) Date of Patent: Jun. 4, 2002

(54) SEMICONDUCTOR DEVICE

(75) Inventors: Yasuo Yamaguchi; Hidekazu Yamamoto, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/679,884

(22) Filed: Oct. 5, 2000

Related U.S. Application Data

(63) Continuation of application No. 09/476,780, filed on Dec. 30, 1999, now Pat. No. 6,271,541.

(30) Foreign Application Priority Data

Jul. 12, 1999 (JP) ............................................ 11-197360

(51) Int. Cl.[7] .............................................. H01L 21/76
(52) U.S. Cl. ...................... 438/412; 438/149; 438/471; 438/592
(58) Field of Search .................................. 438/149, 151, 438/153, 154, 164, 163, 289, 290, 471, 473, 476, 300, 592, 412; 257/347

(56) References Cited

U.S. PATENT DOCUMENTS 5,441,899 A * 8/1995 Nakai et al. ................. 438/766
5,886,385 A * 3/1999 Arisumi et al. ............. 257/347

* cited by examiner

*Primary Examiner*—Douglas Wille
*Assistant Examiner*—Theresa T. Doan
(74) *Attorney, Agent, or Firm*—Oblon, Spivak, McClelland, Maier & Neustadt, P.C.

(57) ABSTRACT

A method of manufacturing a semiconductor device including the steps of (a) forming an element isolation insulating film in an element isolation region of a SOI substrate of a stacked structure in which a semiconductor substrate, insulating layer, and semiconductor layer are stacked in this order, and (b) forming, in an element formation region of the SOI substrate, a transistor having a channel formation region selectively disposed in a main surface of the semiconductor layer, a gate structure on the channel formation region, and source/drain regions disposed is the main surface of the semiconductor layer and the adjacent channel formation region. The method also includes the step of (c) selectively growing, after said steps (a) and (b), a polycrystal semiconductor layer on the source/drain regions in a self-aligned manner, which is prescribed by the element isolation insulating film and the gate structure.

1 Claim, 8 Drawing Sheets

US 6,399,460 B1

SEMICONDUCTOR DEVICE

This application is a continuation of application Ser. No. 09/476,780 filed on Dec. 30, 1999, now U.S. Pat. No. 6,271,541.

BACKGROUND OF THE INVENTION

1. Field of the Invention

The present invention relates to a structure of a semiconductor device using a SOI (Silicon On Insulator) substrate, and a manufacturing method thereof.

2. Description of the Background Art

Semiconductor devices using a SOI substrate can reduce the junction capacitance in source/drain regions and also reduce a substrate bias effect. This leads to a high speed operation and a reduction in power consumption. Further, in semiconductor devices using a SOI substrate, a semiconductor element and a substrate are mutually isolated by the presence of an insulating layer, resulting in high resistance to soft error and high resistance to substrate noise. This enables to increase the reliability of the semiconductor devices. With the miniaturization of semiconductor devices in recent years, it seems difficult to improve various performances of semiconductor devices using a bulk substrate. Therefore, it is estimated that semiconductor devices using a SOI substrate play a dominated role in the device structure in the future.

FIG. 19 is a cross section of the structure of a conventional semiconductor device 100 using a SOI substrate. The semiconductor device 100 comprises a SOI substrate 101 having a stacked structure in which a silicon substrate 102, buried oxide film 103, and SOI layer 104 are stacked in this order. The semiconductor device 100 further comprises a MOS transistor 110 disposed in an element formation region of the SOI substrate 101. The MOS transistor 110 has a channel formation region 105 selectively disposed in a main surface of the SOI layer 104, a gate insulating film 106 on the channel formation region 105, a gate electrode 107 on the gate insulating film 106, and a drain region 108 and a source region 109 disposed in the main surface of the SOI layer 104 and adjacent the channel formation region 105.

The semiconductor device 100 further comprises an element isolation insulating film 111 disposed in the main surface of the SOI layer 104 in an element isolation region of the SOI substrate 101, and an interlayer insulating film 112 disposed on the MOS transistor 110 and on the element isolation insulating film 111. In addition, the semiconductor device 100 includes a contact hole 113 being filled with a conductor and extending through the interlayer insulating film 112 between an upper surface of the interlayer insulating film 112 and an upper surface of the drain region 108; a drain wiring 114 disposed on part of the upper surface of the interlayer insulating film 112 where the contact hole 113 is disposed; a contact hole 115 being filled with a conductor and extending through the interlayer insulating film 112 between an upper surface of the interlayer insulating film 112 and an upper surface of the source region 109; and a source wiring 116 disposed on part of the upper surface of the interlayer insulating film 112 where the contact hole 115 is disposed.

The semiconductor device shown in FIG. 19 is manufactured through various process steps. During these steps, a heavy metal impurity, such as iron, nickel or copper, attaches to the surface of a SOI layer 104 and gets inside the SOI layer 104. For instance, a heavy metal impurity attaches to the surface of a SOI layer 104 through an etching process, and a heavy metal impurity gets inside the SOI layer 104 through an ion implantation.

Now consider the influence of these heavy metal impurities on a gate insulating film 106. The heavy metal impurity attached to the surface of a SOI layer 104 can be removed by cleaning the surface of the SOI layer 104 with acid or alkali, before executing a thermal oxidation for forming the gate insulating film 106. On the other hand, the heavy metal impurity present in a SOI layer 104 cannot be removed by cleaning. In a bulk substrate, a heavy metal impurity can be removed by forming a gettering site on its rear surface, whereas in a SOI substrate a gettering site cannot be formed on its rear surface by the presence of a buried oxide film 103. As a result, the heavy metal impurity present in the SOI layer 104 is entrapped in the gate insulating film 106, thus causing a reduction in the breakdown voltage and reliability of the gate insulating film 106. As stated in the foregoing, the conventional semiconductor device using a SOI substrate has the problem that the heavy metal impurity present in a SOI layer cannot be removed by gettering.

SUMMARY OF THE INVENTION

According to a first aspect of the invention, a semiconductor device comprises: a SOI substrate of a stacked structure in which a semiconductor substrate, insulating layer, and semiconductor layer are stacked in this order; a transistor which is disposed in an element formation region of the SOI substrate and has a channel formation region selectively disposed in a main surface of the semiconductor layer, a gate insulating film on the channel formation region, a gate electrode on the gate insulating film, and source/drain regions disposed in the main surface of the semiconductor layer and adjacent the channel formation region; an interlayer insulating film on the transistor; a polycrystal semiconductor region selectively disposed such as to make no contact with the gate insulating film, on part of the main surface of the semiconductor layer where the source/drain regions are disposed; and a contact hole being filled with a polycrystal semiconductor and extending through the interlayer insulating film between an upper surface of the interlayer insulating film and an upper surface of the polycrystal semiconductor region.

According to a second aspect, a semiconductor device comprises: a SOI substrate of a stacked structure in which a semiconductor substrate, insulating layer, and semiconductor layer are stacked in this order; a transistor which is disposed in an element formation region of the SOI substrate and has a channel formation region selectively disposed in a main surface of the semiconductor layer, a gate insulating film on the channel formation region, a gate electrode on the gate insulating film, and source/drain regions disposed in the main surface of the semiconductor layer and adjacent the channel formation region; and a polycrystal semiconductor region selectively disposed such as to make no contact with the gate insulating film, on part of the main surface of the semiconductor layer where the source/drain regions are disposed.

According to a third aspect, the semiconductor device of the second aspect further comprises: an-interlayer insulating film on the transistor; and a contact hole being filled with a polycrystal semiconductor and extending through the interlayer insulating film between an upper surface of the interlayer insulating film and an upper surface of the polycrystal semiconductor region.

According to a fourth aspect, the semiconductor device according to any one of the first to third aspects further comprises an element isolation insulating film disposed in the main surface of the semiconductor layer in the element isolation region of the SOI substrate, wherein the polycrystal semiconductor region is disposed such as to make no contact with the element isolation insulating film.

According to a fifth aspect of the invention, a semiconductor device comprises: a SOI substrate of a stacked structure in which a semiconductor substrate, insulating layer, and semiconductor layer are stacked in this order; a transistor which is disposed in an element formation region of the SOI substrate and has a channel formation region selectively disposed in a main surface of the semiconductor layer, a gate insulating film on the channel formation region, a gate electrode on the gate insulating film, and source/drain regions disposed in the main surface of the semiconductor layer and adjacent the channel formation region; and a first polycrystal semiconductor region selectively extending through the insulating layer between an upper surface of the insulating layer and a bottom surface of the insulating layer, beneath the source/drain regions.

According to a sixth aspect of the invention, the semiconductor device of the fifth aspect further comprises a second polycrystal semiconductor region connected to the first polycrystal semiconductor region and selectively disposed in the source/drain regions.

According to a seventh aspect of the invention, the semiconductor device of the fifth or sixth aspect further comprises a polycrystal semiconductor layer connected to the first polycrystal semiconductor region and disposed between the semiconductor substrate and the insulating layer.

According to an eighth aspect, a semiconductor device comprises: a SOI substrate of a stacked structure in which a semiconductor substrate, insulating layer, and a semiconductor layer are stacked in this order; a trench-type element isolation insulating film disposed in a main surface of the semiconductor layer such as not to reach the insulating layer, in an element isolation region in the SOI substrate; and a crystal defect region locally disposed in part of the semiconductor layer where the element isolation insulating film is not disposed, in the element isolation region of the SOI substrate.

According to a ninth aspect, a method of manufacturing a semiconductor device comprises the steps of: (a) forming an element isolation insulating film in an element isolation region of a SOI substrate of a stacked structure in which a semiconductor substrate, insulating layer, and semiconductor layer are stacked in this order; (b) forming, in an element formation region of the SOI substrate, a transistor having a channel formation region selectively disposed in a main surface of the semiconductor layer, a gate structure on the channel formation region, and source/drain regions disposed in the main surface of the semiconductor layer and adjacent the channel formation region; and (c) selectively growing, after the steps (a) and (b), a polycrystal semiconductor layer on the source/drain regions in a self-aligned manner, which is prescribed by the element isolation insulating film and the gate structure.

According to a tenth aspect, a method of manufacturing a semiconductor device comprises the steps of: (a) forming, on a main surface of the semiconductor layer in a SOI substrate of a stacked structure in which a semiconductor substrate, insulating layer, and semiconductor layer are stacked in this order, a polycrystal semiconductor layer keeping away from the region where a gate insulating film will be formed; (b) performing a heat treatment, after the step (a), such that an impurity present in the semiconductor layer is removed to the polycrystal semiconductor layer by gettering; and (c) removing the polycrystal semiconductor layer after the step (b).

According to an eleventh aspect, a method of manufacturing a semiconductor device comprises the steps of: (a) selectively forming, in a SOI substrate of a stacked structure in which a semiconductor substrate, insulating layer, and semiconductor layer are stacked in this order, a gate insulating film on a main surface of the semiconductor layer; and (b) implanting, after the step. (a), ions for adjusting the operating threshold voltage of a transistor, into the semiconductor layer beneath the gate insulating film.

With the first aspect, the polycrystal semiconductor region and the polycrystal semiconductor filling the contact hole function as a gettering site, respectively. Therefore, even when a heavy metal impurity gets inside the semiconductor layer during the manufacturing steps of a semiconductor device, the heavy metal impurity can be removed by gettering. Further, since the polycrystal semiconductor region is disposed such as to make no contact with the gate insulating film, the polycrystal semiconductor region has no effect on the electric characteristics of the gate insulating film, thereby avoiding a reduction in the breakdown voltage and reliability of the gate insulating film.

With the second aspect, the polycrystal semiconductor region functions as a gettering site. Therefore, even when a heavy metal impurity gets inside the semiconductor layer during the manufacturing steps of a semiconductor device, the heavy metal impurity can be removed by gettering. Further, since the polycrystal semiconductor region is disposed such as to make no contact with the gate insulating film, the polycrystal semiconductor region has no effect on the electric characteristics of the gate insulating film, thereby avoiding a reduction in the breakdown voltage and reliability of the gate insulating film.

With the third aspect, the gettering capability of the polycrystal semiconductor filling the contact hole can be added to that of the polycrystal semiconductor region. This permits a further increase in the gettering capability of the overall device.

With the fourth aspect, it is avoidable that the isolation characteristic of the element isolation insulating film is deteriorated by the contact between the element isolation insulating film and the polycrystal semiconductor region.

With the fifth aspect, the first polycrystal semiconductor region functions as a gettering site. Therefore, even when a heavy metal impurity gets inside the semiconductor layer during the manufacturing steps of a semiconductor device, it is possible to get rid of the heavy metal impurity from the semiconductor layer to the semiconductor substrate via the first polycrystal semiconductor region. Thereby, the heavy metal impurity can be removed from the semiconductor layer.

With the sixth aspect, the gettering capability of the second polycrystal semiconductor region can be added to that of the first polycrystal semiconductor region. This permits a further increase in the gettering capability of the overall device.

With the seventh aspect, the gettering capability of the polycrystal semiconductor layer can be added to that of the first polycrystal semiconductor region. This permits a further increase in the gettering capability of the overall device.

With the eighth aspect, the crystal defect region functions as a gettering site. Therefore, even when a heavy metal impurity gets inside the semiconductor layer during the manufacturing steps of a semiconductor device, the heavy metal impurity can be removed by gettering.

With the ninth aspect, a polycrystal semiconductor layer functioning as a gettering site can be formed easily on the source/drain regions by a self-aligned selective growth.

With the tenth aspect, after the impurity present in the semiconductor layer is removed to the polycrystal semiconductor layer by gettering, the polycrystal semiconductor layer is removed, which allows the impurity in the semiconductor layer to be discharged outside of the semiconductor device.

With the eleventh aspect, an ion implantation for adjusting the operating threshold voltage of the transistor is performed after forming the gate insulating film. Therefore, even when a heavy metal impurity gets inside the semiconductor layer during the ion implantation, it is possible to prevent the heavy metal impurity from being entrapped in the gate insulating film in the step of forming the gate insulating film. In addition, the gate insulating film is already formed at the time of the ion implantation. Thus, even when a crystal defect occurs in the semiconductor layer due to the ion implantation, the crystal defect entraps the heavy metal impurity, thereby avoiding a reduction in the breakdown voltage and reliability of the gate insulating film.

The present invention aims to overcome the above specified problems of the prior art, and has for its object, in a semiconductor device using a SOI substrate, to remove the heavy metal impurity present in the SOI layer by gettering, and provide a structure and manufacturing method of a semiconductor device capable of realizing an improvement in breakdown voltage and reliability.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
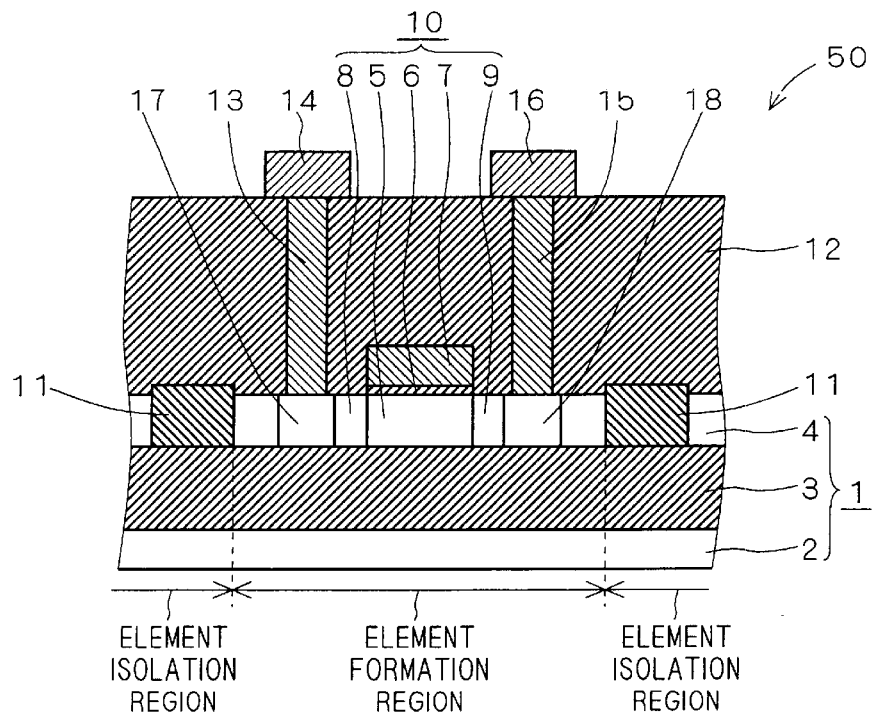
FIG. 1 is a cross section illustrating a structure of a semiconductor device according to a first preferred embodiment of the present invention.

FIG. 1 is a cross section illustrating the structure of a semiconductor device 50 according to a first preferred embodiment of the invention. The semiconductor device 50 has a SOI substrate 1 of a stacked structure in which a silicon substrate 2, a buried oxide film 3 having a film thickness of about 100 to 500 nm, and a SOI layer 4 (single crystalline silicon semiconductor layer) having a film thickness of about 30 to 200 nm, are stacked in this order. The semiconductor device 50 also has a MOS transistor 10 disposed in an element formation region of the SOI substrate 1. The MOS transistor 10 comprises a channel formation region 5 selectively disposed in a main surface of the SOI layer 4 in which an impurity (a p type impurity for a NMOS transistor) in the order of $1 \times 10^{17}$ to $1 \times 10^{18}$ (/cm$^3$) is implanted; a gate insulating film 6 having a film thickness of about 5 nm, disposed on the channel formation region 5; a gate electrode 7 having a gate length of about 0.2 µm, disposed on the gate insulating film 6; and a drain region 8 and a source region 9 in which an impurity (an n type impurity for a NMOS transistor) in the order of $1 \times 10^{19}$ to $1 \times 10^{21}$ (/cm$^3$) is implanted, disposed in the main surface of the SOI layer 4 and adjacent the channel formation region 5.

In addition, the semiconductor device 50 has an element isolation insulating film 11 disposed in the main surface of the SOI layer 4 in an element isolation region of the SOI substrate 1, and an interlayer insulating film 12 disposed on the MOS transistor 10 and en the element isolation insulating film 11. The semiconductor device 50 also has a polysilicon region 17 disposed in part of the main surface of the SOI layer 4 where the drain region 8 is disposed, and a polysilicon region 18 disposed in part of the main surface of the SOI layer 4 where the source region 9 is disposed. Both polysilicon regions 17 and 18 function as a gettering site, and are selectively formed in a buried fashion such as to make no contact with the gate insulating film 6 and element isolation insulating film 11.

The semiconductor device 50 further comprises a contact hole 13 being filled with a doped polysilicon plug functioning as a gettering site, and extending through the interlayer insulating film 12 between an upper surface of the interlayer insulating film 12 and an upper surface of the polysilicon region 17; a drain wiring 14 disposed on part of the interlayer insulating film 12 where the contact hole 13 is disposed; a contact hole 15 being filled with a doped polysilicon plug functioning as a gettering site, and extending through the interlayer insulating film 12 between an upper surface of the interlayer insulating film 12 and an upper surface of a polysilicon region 18; and a source wiring 15 disposed on part of the interlayer insulating film 12 where the contact hole 15 is disposed.

In the semiconductor device 50 according to the first preferred embodiment, the polysilicon region 17 is formed in a buried fashion in the drain region 8, the polysilicon region 18 is formed in a buried fashion in the source region 9, and the contact holes 13 and 15 are filled with the doped polysilicon plug. Therefore, in the event that a heavy metal impurity gets inside the SOI layer 4 during the manufacturing steps of the semiconductor device 50, the polysilicon regions 17, 18 and the doped polysilicon plug filling the contact holes 13, 15 function as a gettering site, respectively. This enables to remove the heavy metal impurity by gettering.

It is particularly desirable that the polysilicon regions 17 and 18 are previously formed before a thermal oxidation process of forming a gate insulating film 6. Thereby, the gate insulating film 6 can be formed after the heavy metal in the SOI layer 4 is removed by gettering, thus preventing the heavy metal impurity from being entrapped in the gate insulating film 6.

By virtue of the construction that the polysilicon regions 17 and 18 are disposed such as to make no contact with the gate insulating film 6, it is avoidable that, due to a difference of thermal expansion coefficient, the polysilicon regions 17 and 18 apply stress to the end of the gate insulating film 6, to cause a leakage current at the junction part beneath the end of the gate insulating film 6. That is, the polysilicon regions 17 and 18 have no effect on the electric characteristics of the gate insulating film 6, thereby preventing a reduction in the breakdown voltage and reliability of the gate insulating film 6.

In addition, by virtue of the construction that the polysilicon regions 17 and 18 are disposed such as to make no contact with the element isolation insulating film 11, it is avoidable that, due to a difference of thermal expansion coefficient, the polysilicon regions 17 and 18 apply stress to the end of the element isolation insulating film 11, to cause a leakage current at the junction part beneath the end of the element isolation insulating film 11. That is, the polysilicon regions 17 and 18 have no effect on the isolation characteristic of the element isolation insulating film 11, thereby preventing a reduction in the isolation characteristic of the element isolation insulating film 11.

Second Preferred Embodiment

Figure 2:
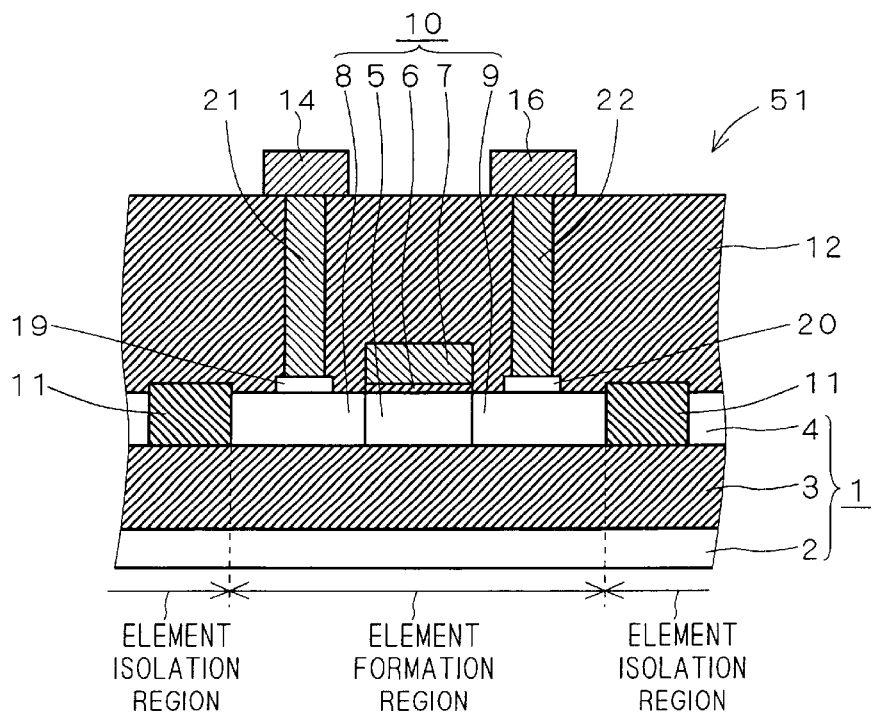
FIG. 2 is a cross section illustrating a structure of a semiconductor device according to a second preferred embodiment.

FIG. 2 is a cross section illustrating a semiconductor device 51 according to a second preferred embodiment. Like the semiconductor device 50 of the first preferred embodiment in FIG. 1, the semiconductor device 51 comprises a SOI substrate 1, MOS transistor 10, interlayer insulating film 12, element isolation insulating film 11, drain wiring 14, and source wiring 16.

The semiconductor device 51 has a polysilicon region 19 disposed on part of a main surface of the SOI layer 4 where a drain region 8 is disposed, and a polysilicon region 20 disposed on part of the main surface of the SOI layer 4 where a source region 9 is disposed. Both polysilicon regions 19 and 20 function as a gettering site, and are selectively disposed such as to make no contact with a gate insulating film 6 and element isolation insulating film 11. The polysilicon regions 19 and 20 can be formed by the steps of depositing a polysilicon film on the entire surface of the main surface of the SOI layer 4 by CVD process; forming a resist having a predetermined opening pattern, on the polysilicon film by photomechanical process; and etching the polysilicon film by using the resist as a mask.

The semiconductor device 51 further comprises a contact hole 21 being filled with a metal plug, such as aluminum, and extending through the interlayer insulating film 12 between an upper surface of the interlayer insulating film 12 and an upper surface of the polysilicon region 19; and a contact hole 22 being filled with a metal plug, such as aluminum, and extending through the interlayer insulating film 12 between an upper surface of the interlayer insulating film 12 and an upper surface of the polysilicon region 20.

In the semiconductor device 51 according to the second preferred embodiment, the polysilicon region 19 is disposed in the drain region 8, and the polysilicon region 20 is disposed in the source region 9. Therefore, in the event that a heavy metal impurity gets inside the SOI layer 4 during the manufacturing steps of the semiconductor device 51, the polysilicon regions 19 and 20 function as a gettering site, respectively. This enables to remove the heavy metal impurity by gettering.

It is particularly desirable that the polysilicon regions 19 and 20 are previously formed before a thermal oxidation process of forming a gate insulating film 6. Thereby, the gate insulating film 6 can be formed after the heavy metal in the SOI layer 4 is removed by gettering, thus preventing the heavy metal impurity from being entrapped in the gate insulating film 6.

By virtue of the construction that the polysilicon regions 19 and 20 are disposed such as to make no contact with the gate insulating film 6, there is no possibility that the polysilicon regions 19 and 20 have any adverse effect on the electric characteristics of the gate insulating film 6, thereby preventing a reduction in the breakdown voltage and reliability of the gate insulating film 6.

In addition, by virtue of the construction that the polysilicon regions 19 and 20 are disposed such as to make no contact with the element isolation insulating film 11, the polysilicon regions 19 and 20 have no effect on the isolation characteristic of the element isolation insulating film 11, thereby preventing a reduction in the isolation characteristic of the element isolation insulating film 11.

Figure 3:
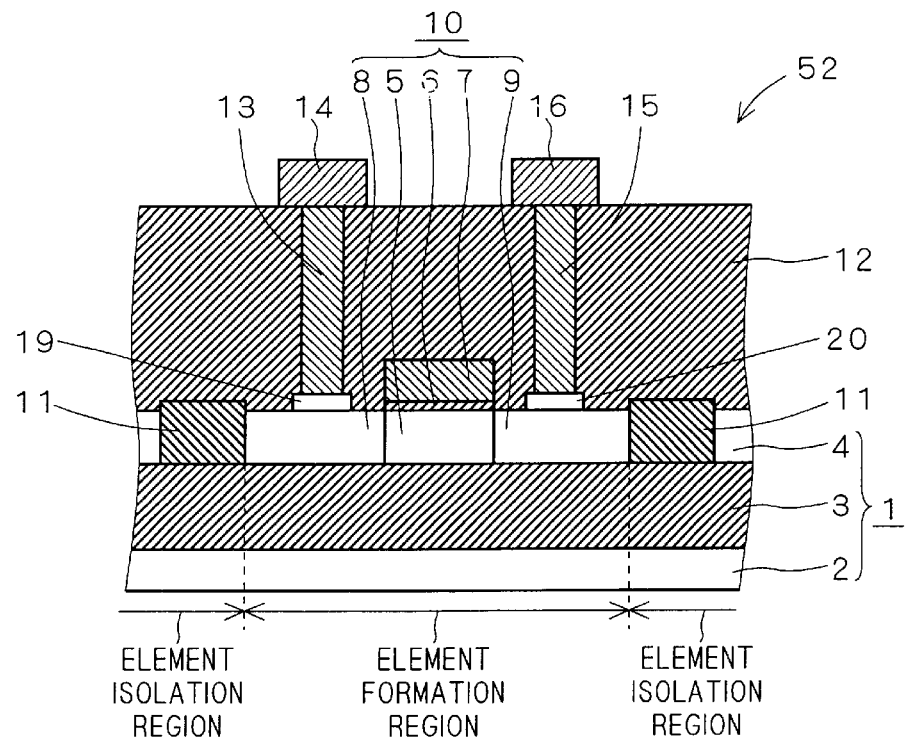
FIG. 3 is a cross section illustrating a structure of a semiconductor device according to a modification of the second preferred embodiment.

FIG. 3 is a cross section illustrating the structure of a semiconductor device 52 according to a modification of the second preferred embodiment. The semiconductor device 52 is formed on the basis of the semiconductor device 51 of FIG. 2, and characterized in having contact holes 13 and 15 filled with a doped polysilicon plug functioning as a gettering site, instead of the contact holes 21 and 22 filled with a metal plug. Thereby, the gettering capability of the doped polysilicon plug can be added to, that of the polysilicon regions 19 and 20. This permits a further increase in the gettering capability of the overall device.

Third Preferred Embodiment

Figure 4:
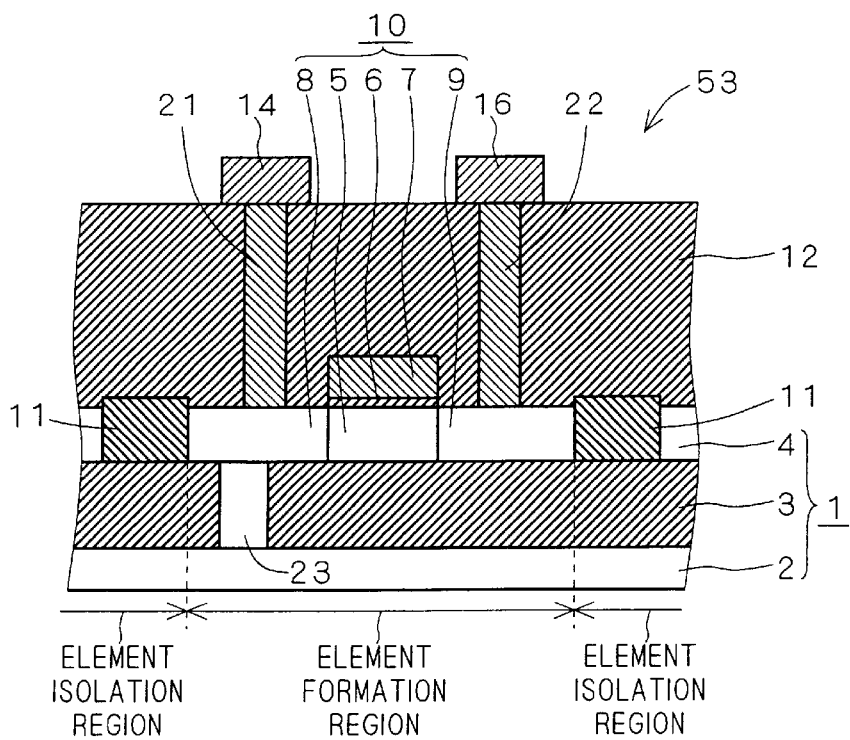
FIG. 4 is a cross section illustrating a structure of a semiconductor device according to a third preferred embodiment.

FIG. 4 is a cross section illustrating a semiconductor device 53 according to a third preferred embodiment. Like the semiconductor device 50 of the first preferred embodiment in FIG. 1 the semiconductor device 53 comprises a SOI substrate 1, MOS transistor 10, interlayer insulating film 12, element isolation insulating film 11, drain wiring 14, and source wiring 16.

The semiconductor device 53 has a polysilicon region 23 functioning as a gettering site, which is formed in a buried fashion between an upper surface of a buried oxide film 3 disposed beneath a drain region 8 and a bottom surface of the buried oxide film 3, such as to selectively extend through the buried oxide film 3.

The semiconductor device 53 further comprises a contact hole 21 being filled with a metal plug, such as aluminum, and extending through the interlayer insulating film 12 between an uppersurface of the interlayer insulating film 12 and an upper surface of the drain region 8; and a contact hole 22 being filled with a metal plug, such as aluminum, and extending through the interlayer insulating film 12 between an upper surface of the interlayer insulating film 12 and an upper surface of a source region 9.

In the semiconductor device 53 according to the third preferred embodiment, a polysilicon region 23 extending between the drain region 8 and a silicon substrate 2 is formed in a buried fashion in the buried oxide film 3. Therefore, in the event that a heavy metal impurity gets inside the SOI layer 4 during the manufacturing steps of the semiconductor device 53, it is possible to get rid of the heavy metal impurity from the SOI layer 4 to the silicon substrate 2 via the polysilicon region 23. This enables to remove the heavy metal impurity from the SOI layer 4.

Additionally, the polysilicon region 23 functioning as a gettering site is disposed beneath the drain region 8. Thereby, as compared with the case where a polysilicon region extending through a buried oxide film is disposed in an element isolation region, the distance between the gettering site and gate region is shorter, which leads to an improved gettering effect.

It is particularly desirable that the polysilicon region 23 is previously formed before a thermal oxidation process of forming a gate insulating film 6. Thereby, the gate insulating film 6 can be formed after getting rid of the heavy metal in the SOI layer 4 toward the silicon substrate 2, thus preventing the heavy metal impurity from being entrapped in the gate insulating film 6.

Figure 5:
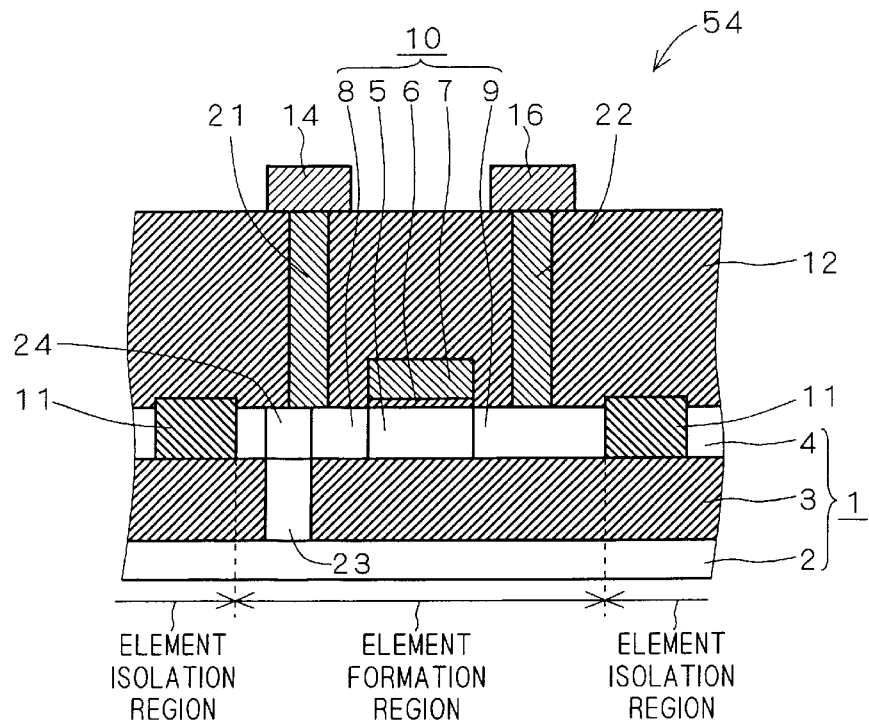
FIG. 5 is a cross section illustrating a structure of a semiconductor device according to a modification of the third preferred embodiment.

FIG. 5 is a cross section illustrating the structure of a semiconductor device 54 according to a modification of the third preferred embodiment. The semiconductor device 54 is formed on the basis of the semiconductor device 53 of FIG. 4, and characterized in that a polysilicon region 24 connected to the polysilicon region 23 is selectively formed in a buried fashion in the drain region 3. Thereby, the gettering capability of the polysilicon region 24 can be added to that of the polysilicon region 23. This permits a further increase in the gettering capability of the overall device.

Figure 6:
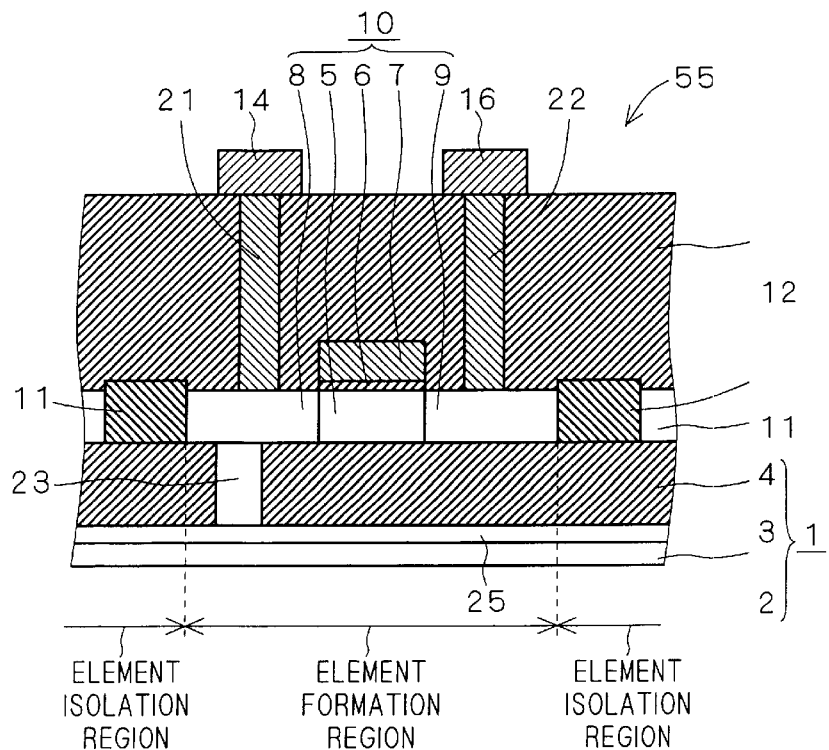
FIG. 6 is a cross section illustrating a structure of a semiconductor device according to another modification of the third preferred embodiment.

FIG. 6 is a cross section illustrating the structure of a semiconductor device 55 according to another modification of the third preferred embodiment. The semiconductor device 55 is formed on the basis of the semiconductor device 53 in FIG. 4, or the semiconductor device 54 in FIG. 5, and characterized in that a polysilicon layer 25 connected to the polysilicon region 23 is formed in layer, between the silicon substrate 2 and buried oxide film 3. Thereby, the gettering capability of the polysilicon layer 25 can be added to that of the polysilicon region 23. This permits a further increase in the gettering capability of the overall device. Also, the heavy metal impurity removed to the polysilicon region 23 by gettering, can be kept away from a gate region, thereby preventing the heavy metal impurity from rediffusing from the polysilicon region 23 to the SOI layer 4. Instead of the polysilicon layer 25, a radiation damage region may be formed by ion implantation. This offers the same effect as in the foregoing.

Fourth Preferred Embodiment

Figure 7:
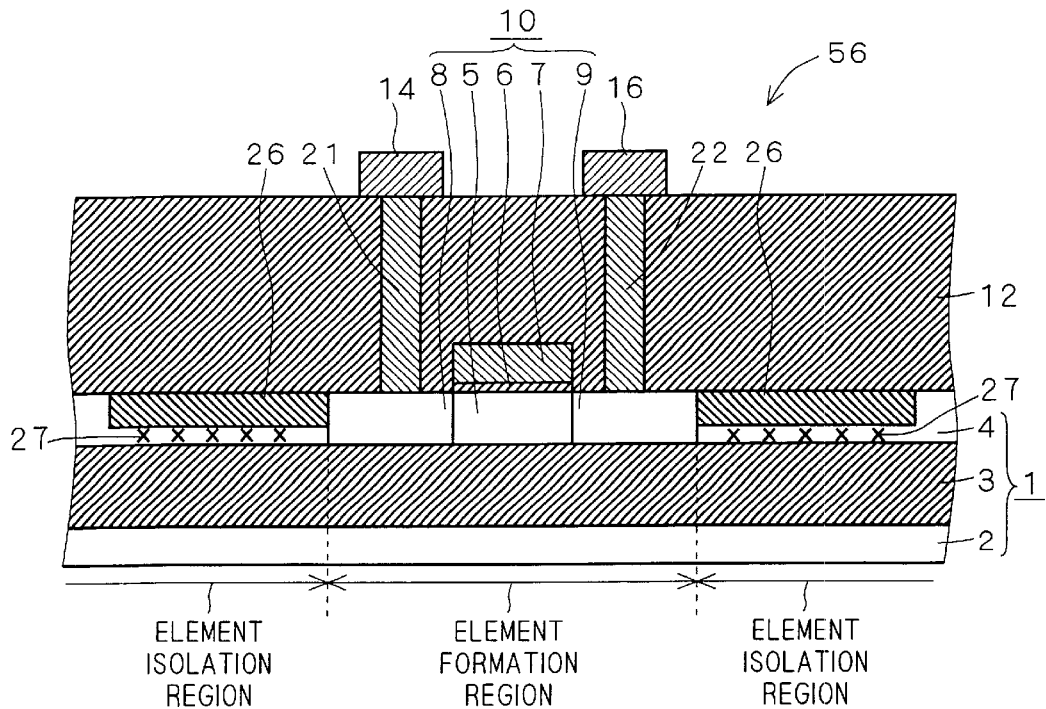
FIG. 7 is a cross section illustrating a structure of a semiconductor device according to a fourth preferred embodiment.
Figure 8:
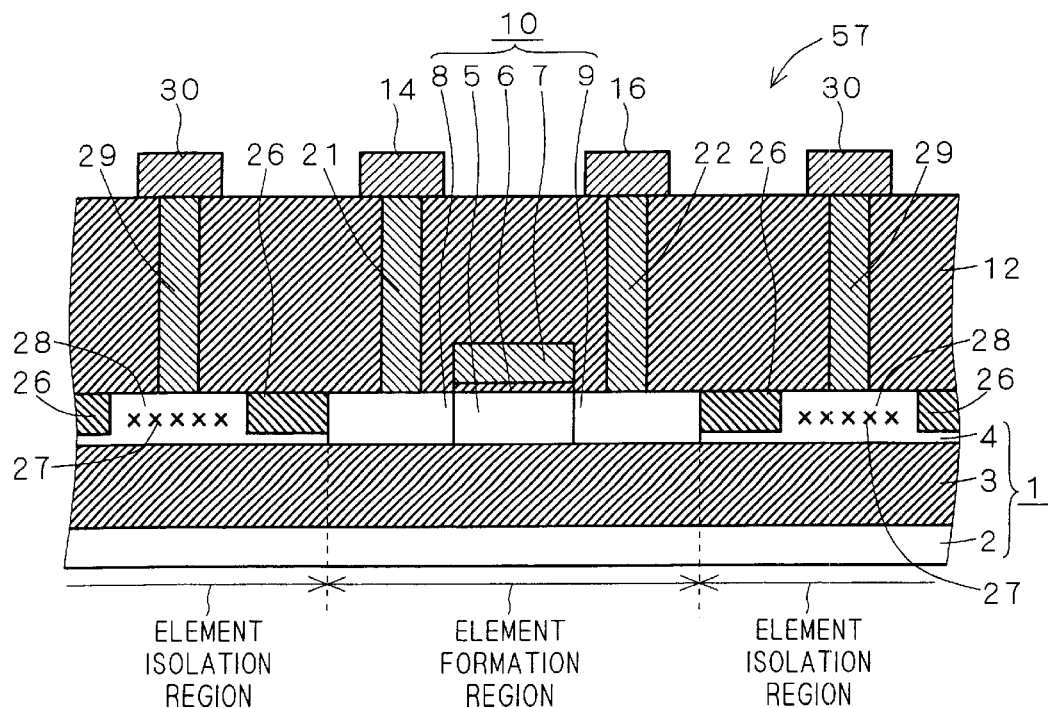
FIG. 8 is a cross section illustrating another structure of a semiconductor device according to the fourth preferred embodiment.

FIGS. 7 and 8 are cross sections illustrating semiconductor devices 56 and 57, respectively, according to a fourth preferred embodiment. Like the semiconductor device 50 of the first preferred embodiment in FIG. 1, the semiconductor devices 56 and 57 comprise a SOI substrate 1, MOS transistor 10, interlayer insulating film 12, drain wiring 14, and source wiring 16.

The semiconductor devices 56 and 57 have a partial trench-type element isolation insulating film 26 disposed in a main surface of a SOI layer 4 such as not to reach an upper surface of a buried oxide film 3, in an element isolation region of the SOI substrate 1. The semiconductor device 57 further comprises a body region 28 selectively disposed in the main surface of the SOI layer 4 in the element isolation region; a wiring 30 disposed on an upper surface of the interlayer insulating film 12 above the body region 28; and a contact hole 29 filled with a metal plug, such as aluminum, and selectively disposed in the interlayer insulating film 12 such as to contact with the body region 28 and wiring 30.

The semiconductor devices 56 and 57 include a crystal defect region 27 locally disposed in part of the SOI layer 4 where the partial trench-type element isolation insulating film 26 is not disposed, in the element isolation region of the SOI substrate 1. Specifically, the crystal defect region 27 of the semiconductor device 56 is locally disposed in the SOI layer 4 between a bottom surface of the partial trench-type element isolation insulating film 26 and an upper surface of the buried oxide film 3. The crystal defect region 27 of the semiconductor device 57 is locally disposed in the body region 28. The crystal defect region 27 can be obtained as a radiation damage region due to an ion implantation.

The semiconductor devices 56 and 57 further include a contact hole 21 being filled with a metal plug, such as aluminum, and extending through the interlayer insulating film 12 between an upper surface of the interlayer insulating film 12 and an upper surface of a drain region 8; and a contact hole 22 being filled with a metal plug, such as aluminum, and extending through the interlayer insulating film 12 between an upper surface of the interlayer insulating film 12 and an upper surface of a source region 9.

In the semiconductor devices 56 and 57 according to the fourth preferred embodiment, the crystal defect region 27 is disposed in part of the SOI layer 4 where the partial trench-type element isolation insulating film 26 is not disposed, in the element isolation region of the SOI substrate 1. Therefore, in the event that a heavy metal impurity gets inside the-SOI layer-4 during the manufacturing steps of the semiconductor devices 56 or 57, the crystal defect region 27 functions as a gettering site, which enables to remove the heavy metal impurity by gettering.

Thanks to an excellent element isolation characteristic of the partial trench-type element isolation insulating film 26, even when the semiconductor devices 56 and 57 are miniaturized, it is possible to increase the gettering capability while maintaining the element isolation characteristic at a high level.

It is particularly desirable that the crystal defect region 27 is previously formed before a thermal oxidation process of forming a gate insulating film 6. Thereby, the gate insulating film 6 can be formed after the heavy metal in the SOI layer 4 is removed by gettering, thus preventing the heavy metal impurity from being entrapped in the gate insulating film 6.

Fifth Preferred Embodiment

Figure 9:
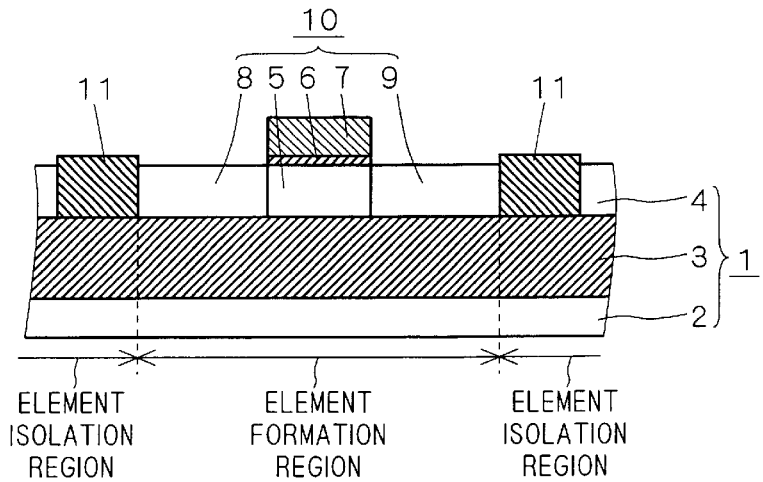
FIGS. 9 to 11 are cross sections illustrating a sequence of steps in a method of manufacturing a semiconductor device according to a fifth preferred embodiment.
Figure 10:
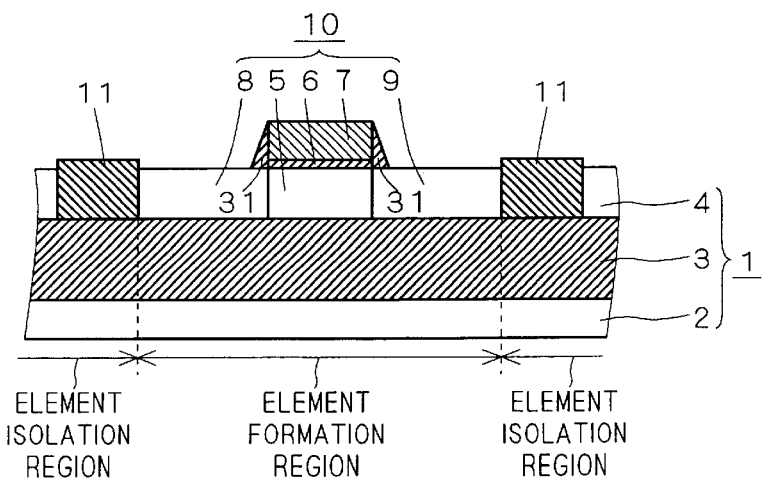
Figure 11:
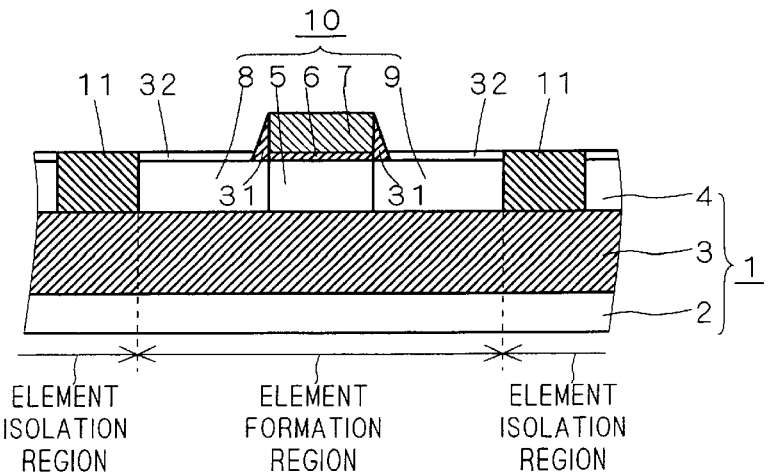

FIGS. 9 to 11 are cross sections illustrating a sequence of steps in a method of manufacturing a semiconductor device according to a fifth preferred embodiment. Firstly, an element isolation insulating film 11 comprised of a silicon oxide film is formed in an element isolation region of a SOI substrate 1, in a well known manner. Then, there is formed in an element formation region of the SOI substrate 1 is a MOS transistor 10 which comprises a channel formation region 5 selectively disposed in a main surface of a SOI layer 4 comprised of silicon, a gate insulating film 6 on the channel region 5, a gate electrode 7 on the gate insulating film 6, and a drain region 8 and a source region 9 disposed in the main surface of the SOI layer 4 and adjacent the channel region 5 (FIG. 9).

After depositing a silicon oxide film on the entire surface by CVD process, the silicon oxide film is etched by an anisotropic dry etching process whose etching rate is increased in the direction of thickness of the SOI substrate 1. This results in that side walls 31 comprised of a silicon oxide film are formed on the side surfaces of the gate insulating film 6 and gate electrode 7 (FIG. 10).

Subsequently, a polysilicon layer 32 is formed in a self-aligned manner on the drain region 8 and source region 9, respectively, by selectively growing polysilicon under the conditions that it does not grow on a silicon oxide film but grows on silicon (FIG. 11). The polysilicon layer 32 functions as a gettering site. Therefore, in the event that a heavy metal impurity gets inside the SOI layer 4 during the manufacturing steps of semiconductor devices, the heavy metal impurity can be removed by gettering.

Thus, in the method of manufacturing a semiconductor device according to the fifth preferred embodiment, the polysilicon layer 32 can be formed in a self-aligned manner on the drain region 8 and source region 9. This enables to simplify the manufacturing steps, as compared to the case where a polysilicon layer 32 is formed by CVD process, photomechanical process, and etching process.

Sixth Preferred Embodiment

Figure 12:
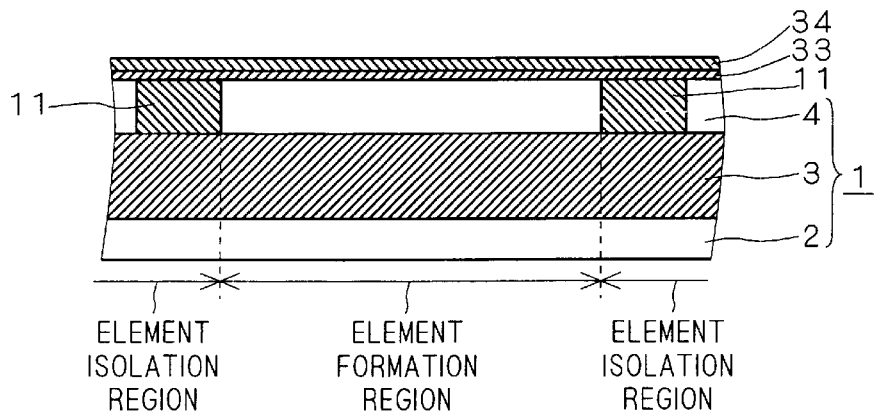
FIGS. 12 to 15 are cross sections illustrating a sequence of steps in a method of manufacturing a semiconductor device according to a sixth preferred embodiment.

FIGS. 12 to 15 are cross sections illustrating a sequence of steps in a method of manufacturing a semiconductor device according to a sixth preferred embodiment. Firstly, an element isolation insulating film 11 is formed in an element isolation region of a SOI substrate 1, in a well known manner. Then, a silicon oxide film 33 and silicon nitride film 34 are deposited in this order on the entire surface of a SOI layer 4 by CVD process (FIG. 12).

Figure 13:
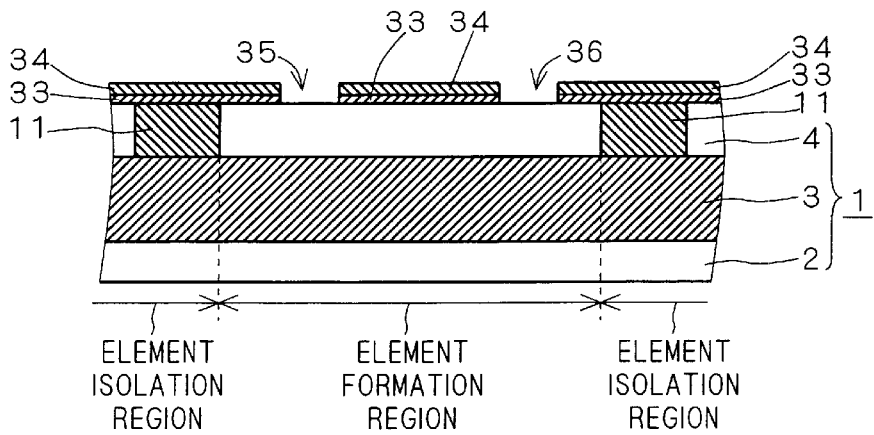

Subsequently, a resist having a predetermined opening pattern is formed on the silicon nitride film 34 by photomechanical process. By using the resist as a mask, the silicon nitride film 34 and silicon oxide film 33 are subjected to dry etching in this order, so that openings 35 and 36 are formed above regions where a drain region 8 and a source region 9 will be formed later, respectively (FIG. 13).

Figure 14:
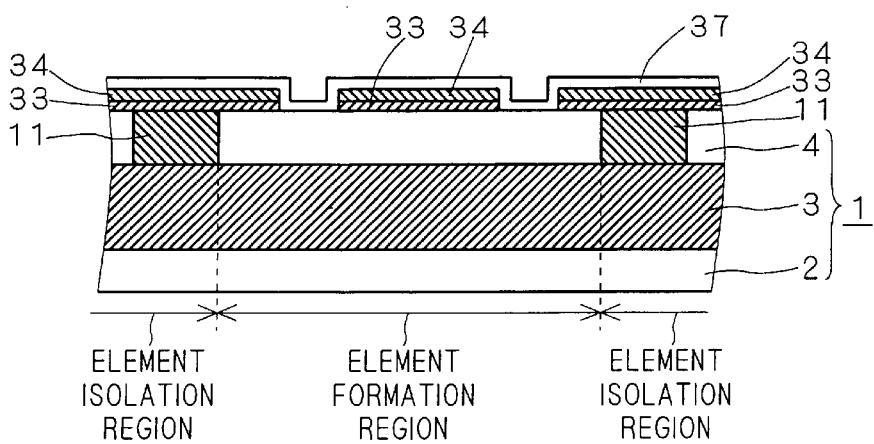

Then, a polysilicon film 37 functioning as a gettering site, is deposed on the entire surface by CVD process (FIG. 14). Thereafter, with a heat treatment, the heavy metal impurity present in the SOI layer 4 is removed by gettering.

Figure 15:
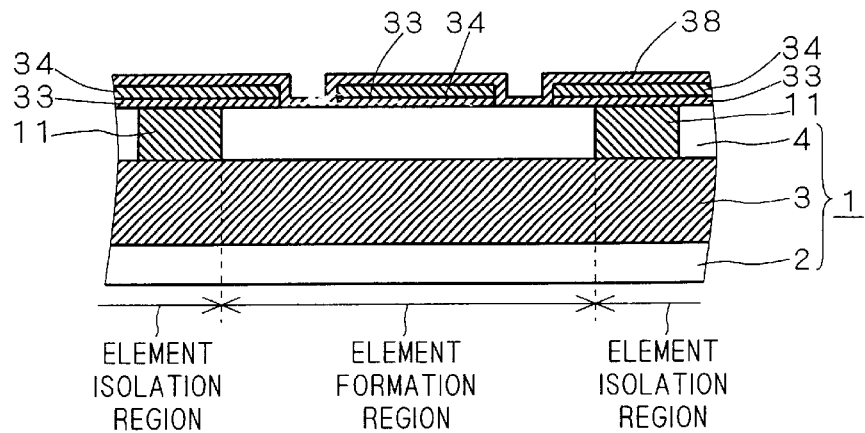

The polysilicon film 37 is then subjected to a thermal oxidation by thermal oxidation process, to form a silicon oxide film 38 (FIG. 15). The silicon oxide film 38 is then removed by a wet etching process using hydrofluoric acid. After the silicon oxide film 33 and silicon nitride film 34 remaining on the SOI layer 4 are removed by a wet etching process or the like, a MOS transistor 10 is formed in the element formation region of the SOI substrate 1, in a well known manner.

It should be noted that, though the foregoing description has been presented by way of example as related to the formation of a complex film of the silicon oxide film 33 and silicon nitride film 34 on the SOI layer 4, a single layer film of a silicon oxide film may be formed instead of the complex film.

Also, though the foregoing description has been presented by way of example as related to that the silicon oxide film 38 is obtained by subjecting the polysilicon film 37 to a thermal oxidation, and the silicon oxide film 38 is then removed, the polysilicon film 37 may be directly removed by a wet etching process using ammonia and hydrogen peroxide, or a dry etching process using $CF_4$ plasma.

Thus, in the method of manufacturing a semiconductor device according to the sixth preferred embodiment, the polysilicon film 37 is removed after the heavy metal impurity in the SOI layer 4 is removed to the polysilicon film 37 by gettering. Thereby, the heavy metal impurity in the SOI layer 4 can be discharged outside of a wafer. It is therefore possible to prevent the heavy metal impurity from being entrapped in a gate insulating film of a MOS transistor formed later.

In addition, the polysilicon film 37 is formed such as to reach only above regions where a drain region 8 and a source region 9 will be formed later, whereas it is not formed above a region where a gate insulating film 6 will be formed later, on the main surface of the SOI layer 4. Therefore, even if the main surface of the SOI layer 4 is damaged during the step of removing the polysilicon film 37, there is no possibility of damage to part of the main surface of the SOI layer 4 where the gate insulating film 6 will be formed later. This avoids a reduction in the breakdown voltage and reliability of the gate insulating film 6.

Seventh Preferred Embodiment

Figure 16:
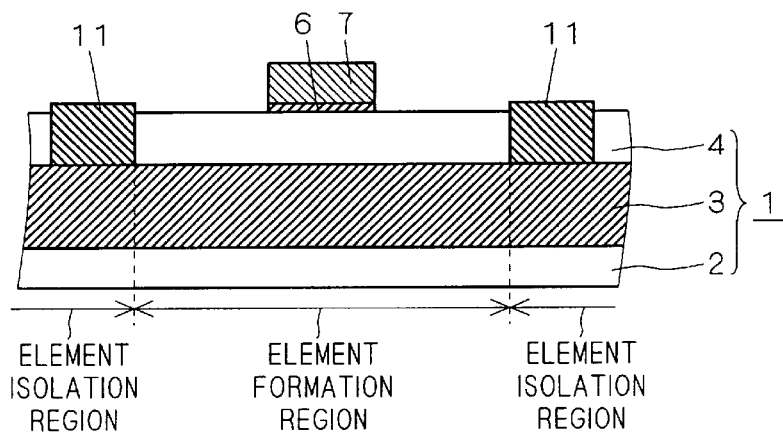
FIGS. 16 to 18 are cross sections illustrating a sequence of steps in a method of manufacturing a semiconductor device according to a seventh preferred embodiment.
Figure 17:
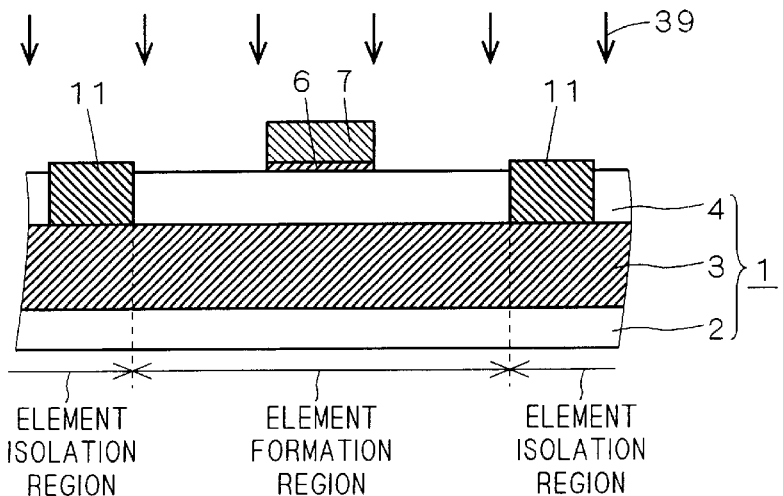
Figure 18:
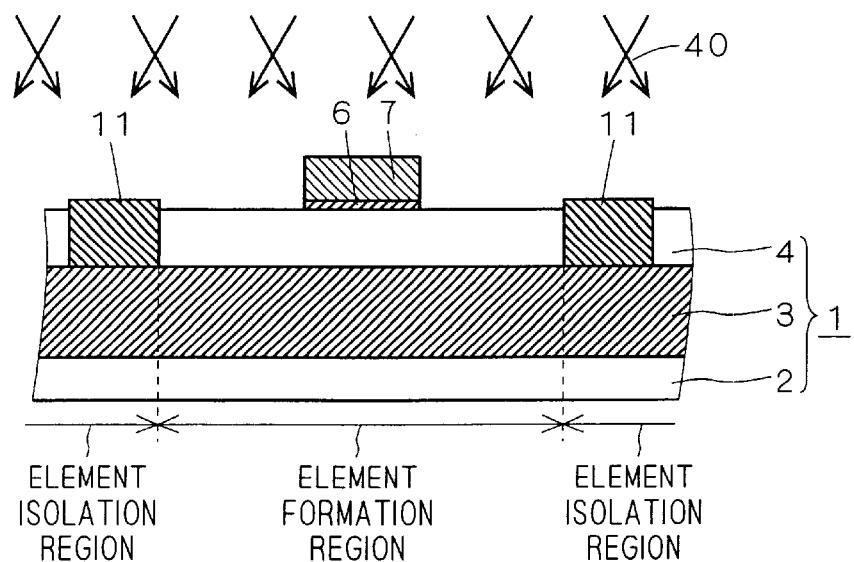
Figure 19:
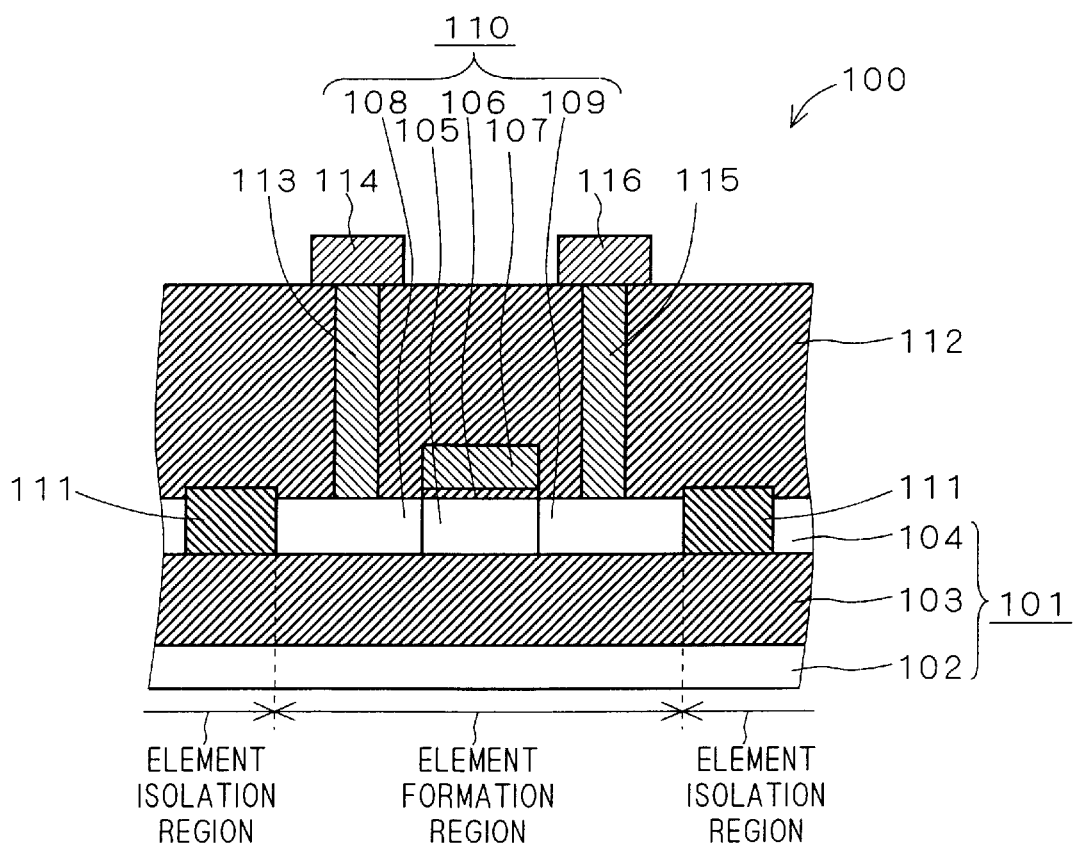
FIG. 19 is a cross section illustrating a structure of a conventional semiconductor device.

FIGS. 16 to 18 are cross sections illustrating a sequence of steps in a method of manufacturing a semiconductor device according to a seventh preferred embodiment. Firstly, an element isolation insulating film 11 is formed in an element isolation region of a SOI substrate 1, in a well known manner. Then, a gate insulating film 6 and gate electrode 7 are selectively formed on a main surface of a SOI layer 4, in a well known manner (FIG. 16).

Subsequently, a channel doping for adjusting the operating threshold voltage of a MOS transistor is performed. For example, at an accelerated voltage of 20 keV and a concentration of $5 \times 10^{12}$ (/cm$^2$), ions (boron ions in the manufacture of a NMOS transistor) 39 are implanted over the gate electrode 7 in the SOI layer 4 (FIG. 17). Alternatively, at an accelerated voltage of 50 keV and a concentration of $1 \times 10^{13}$ (/cm$^2$), ions 40 is implanted into the SOI layer 4 from an oblique direction of at about 60° with respect to the normal to the main surface of the SOI layer 4 (FIG. 18). Thereafter, a drain region 8 and a source region 9 are formed in the SOI layer 4 by ion implantation and thermal diffusion process.

Thus, in the method of manufacturing a semiconductor device according to the seventh preferred embodiment, the channel doping is performed after the step of forming the gate insulating film 6. Therefore, in the event that a heavy metal impurity gets inside the SOI layer 4 during the channel doping, it is possible to prevent the heavy metal impurity from being entrapped in the gate insulating film 6 in the step of forming the gate insulating film 6. In addition, since the gate insulating film 6 is already formed at the time of the channel doping, even when a crystal defect occurs in the SOI layer 4 due to the channel doping, the crystal defect entraps the heaving metal impurity, thereby avoiding a reduction in the breakdown voltage and reliability of the gate insulating film 6.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising the steps of:

(a) forming an element isolation insulating film in an element isolation region of a SOI substrate of a stacked structure in which a semiconductor substrate, insulating layer, and semiconductor layer are stacked in this order;

(b) forming, in an element formation region of said SOI substrate, a transistor having a channel formation region selectively disposed in a main surface of said semiconductor layer, a gate structure on said channel formation region, and source/drain regions disposed in said main surface of said semiconductor layer and adjacent said channel formation region; and (c) selectively growing, after said steps (a) and (b), a polycrystal semiconductor layer on said source/drain regions in a self-aligned manner, by means of said element isolation insulating film and said gate structure.

* * * * *